United States Patent
Griswold et al.

(10) Patent No.: US 7,652,474 B2
(45) Date of Patent: Jan. 26, 2010

(54) CONJUGATE SYMMETRY IN PARALLEL IMAGING

(76) Inventors: Mark A. Griswold, 3135 Huntington Rd., Shaker Heights, OH (US) 44120; Martin Blaimer, 2201 Grandview Ave., Cleveland Heights, OH (US) 44106; Herbert Koestler, Valentin-Rosel-Str. 4, 97225 Retz bach (DE)

( * ) Notice: Subject to any disclaimer, the term of this patent is extended or adjusted under 35 U.S.C. 154(b) by 0 days.

(21) Appl. No.: 12/151,025

(22) Filed: May 2, 2008

(65) Prior Publication Data

US 2008/0278161 A1 Nov. 13, 2008

Related U.S. Application Data

(60) Provisional application No. 60/927,225, filed on May 2, 2007.

(51) Int. Cl.
*G01V 3/00* (2006.01)
(52) U.S. Cl. .................... 324/307; 324/318
(58) Field of Classification Search ......... 324/300–322; 600/410–435
See application file for complete search history.

(56) References Cited

U.S. PATENT DOCUMENTS

| 6,804,546 B1 * | 10/2004 | Thompson et al. ......... 600/410 |
| 6,882,148 B2 * | 4/2005 | Pipe ......................... 324/307 |
| 7,382,127 B2 * | 6/2008 | Gaddipati et al. .......... 324/309 |

* cited by examiner

*Primary Examiner*—Brij B Shrivastav
*Assistant Examiner*—Dixomara Vargas
(74) *Attorney, Agent, or Firm*—Kraguljac & Kalnay, LLC (57) ABSTRACT

Example systems, methods, and apparatus associated with conjugate symmetry in parallel imaging are provided. One example method includes controlling a parallel magnetic resonance imaging (pMRI) apparatus to acquire a first magnetic resonance (MR) signal from a first point in k-space using a phased array of receiving coils. The method also includes identifying a second point in k-space that is related to the first point by a conjugate symmetry relation. The relation may be, for example, a reflection, a rotation, and so on. The method also includes determining a second MR signal associated with the second point based, at least in part, on the first MR signal and the conjugate symmetry relation and then reconstructing an MR image based, at least in part, on both the first MR signal and the second MR signal.

17 Claims, 7 Drawing Sheets

CONJUGATE SYMMETRY IN PARALLEL IMAGING

CROSS REFERENCE TO RELATED APPLICATIONS

This application claims the benefit of U.S. Provisional Patent 60/927,225, filed May 2, 2007, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic Resonance Imaging (MRI) apparatus employed in parallel MRI (pMRI) may acquire signals in parallel using an array of detectors (e.g., coils). The detectors may be arranged in a phased array of coils. Signals received at the coils are used in reconstruction. Reconstruction quality may depend on the amount of data made available by the coils. Reconstruction quality may also depend on understanding the actual sensitivity and spatial encoding capabilities of a coil(s) during an MRI session so that the signals can be meaningfully processed. Thus, additional auto-calibration signal (ACS) lines may be acquired during certain types of pMRI and used to calibrate the coils. Auto-calibrating refers to calibration of the coil sensitivities at the time of image acquisition.

Conventionally, only actual signals received from actual coils have been used for reconstruction. However, additional information useful for image reconstruction may have been available through conjugate symmetry. Conventional conjugate symmetry methods, to the extent they were used at all, required high resolution information about the background phase. Since this information was difficult to obtain, this limited the use of conjugate symmetry.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example systems and methods employ conjugate symmetry to acquire additional information to improve reconstruction in pMRI. Example systems and methods are described in connection with GRAPPA (Generalized Auto-calibrating Partially Parallel Acquisitions). However, it is to be appreciated that example systems and methods may be employed with other auto-calibrating techniques and may be employed with various trajectories (e.g., Cartesian, non-Cartesian).

One conjugate symmetry relationship between points in k-space can be described using:

$$S(k)=S(-k)^*,$$

where $S(k)$ is a signal acquired from a position k in k-space, and where * is the complex conjugate.

In this example, the complex conjugate of a k-space data point is acquired by changing the sign of the imaginary part of a complex number associated with $S(k)$. This effects a 180 degree rotation in k-space, which corresponds to a reflection in both the vertical and horizontal axis. Consider FIG. 1, which illustrates a point k in the lower right quadrant of k-space. A signal in coils 130 may be associated with point k. Using conjugate symmetry, information may also be associated with the complex conjugate of point −k. This information may be used to construct virtual coils 140, which may be used to "acquire" signal associated with point −k.

Figure 1:
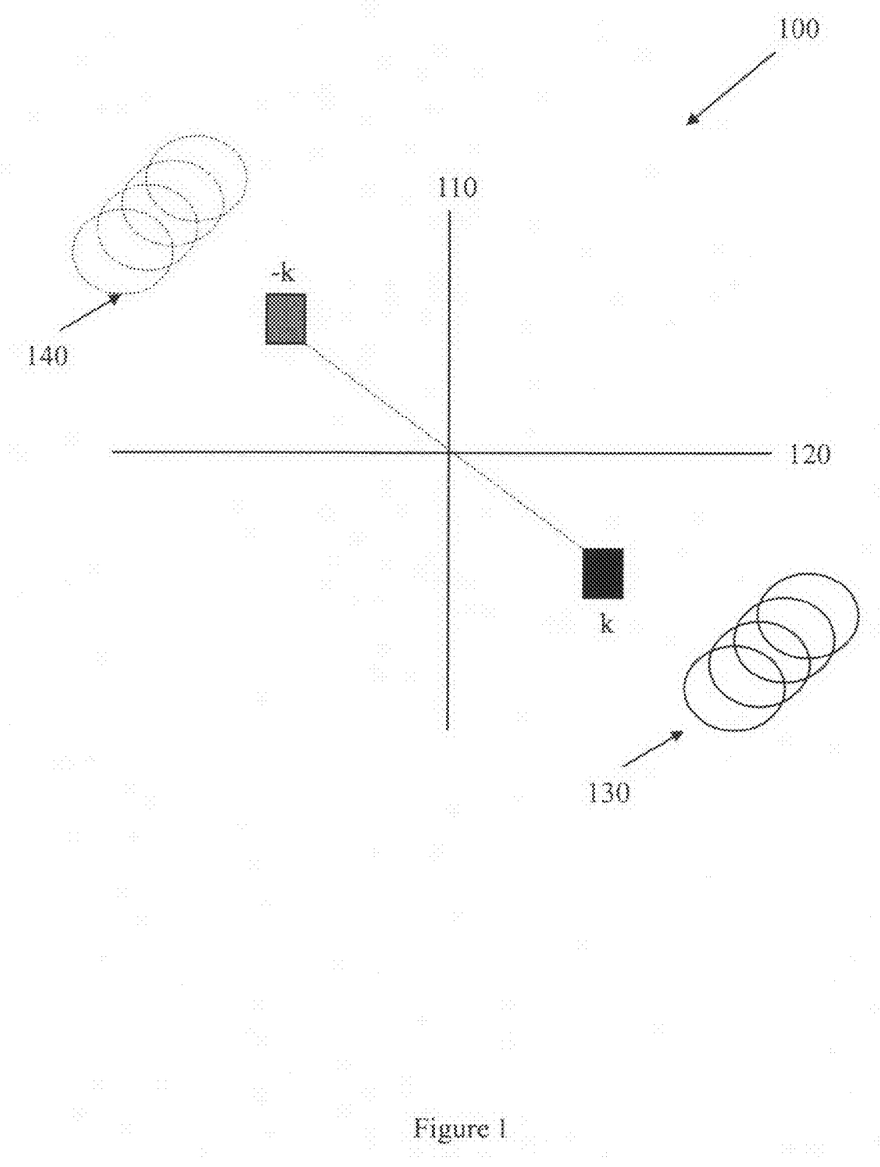
FIG. 1 illustrates a point in k-space, a real set of coils used in parallel acquisition, and a virtual set of coils.

Using a coil array (e.g., 130) with $N_c$ elements, signals associated with a virtual coil (e.g., 140) elements are generated according to:

$$S(j+N_c, k)=S(j, -k)^* \; j=1,\ldots N_c.$$

These signals facilitate generating virtual coils with conjugate coil sensitivity profiles. Example systems and methods use the additional sensitivity encoding information provided by the conjugate coil sensitivity profiles. Using this additional information, the encoding capabilities of the coil array are improved. This in turn results in additional data for reconstruction that produces a reduced geometry factor and better image quality (e.g., reduce noise, reduced artifacts).

The detectors in a pMRI apparatus may be arranged in a phased array of coils (e.g., 130). Individual coils may receive signals associated with a projection along a spatial direction. Individual coils may have different sensitivities based on their directional relationship to the projection and their location in the phased array. Thus, different coils may make different contributions to a received signal. In vivo coil sensitivity calibrations facilitate accurate pMRI reconstruction. Thus, in one embodiment, the example systems and methods are employed in a GRAPPA environment that employs additional ACS lines for auto-calibration. In contrast to image domain approaches, no phase maps or coil sensitivity maps have to be calculated since they are inherent in a GRAPPA reconstruction when using variable density (VD) or time-interleaved acquisition schemes.

Figure 2:
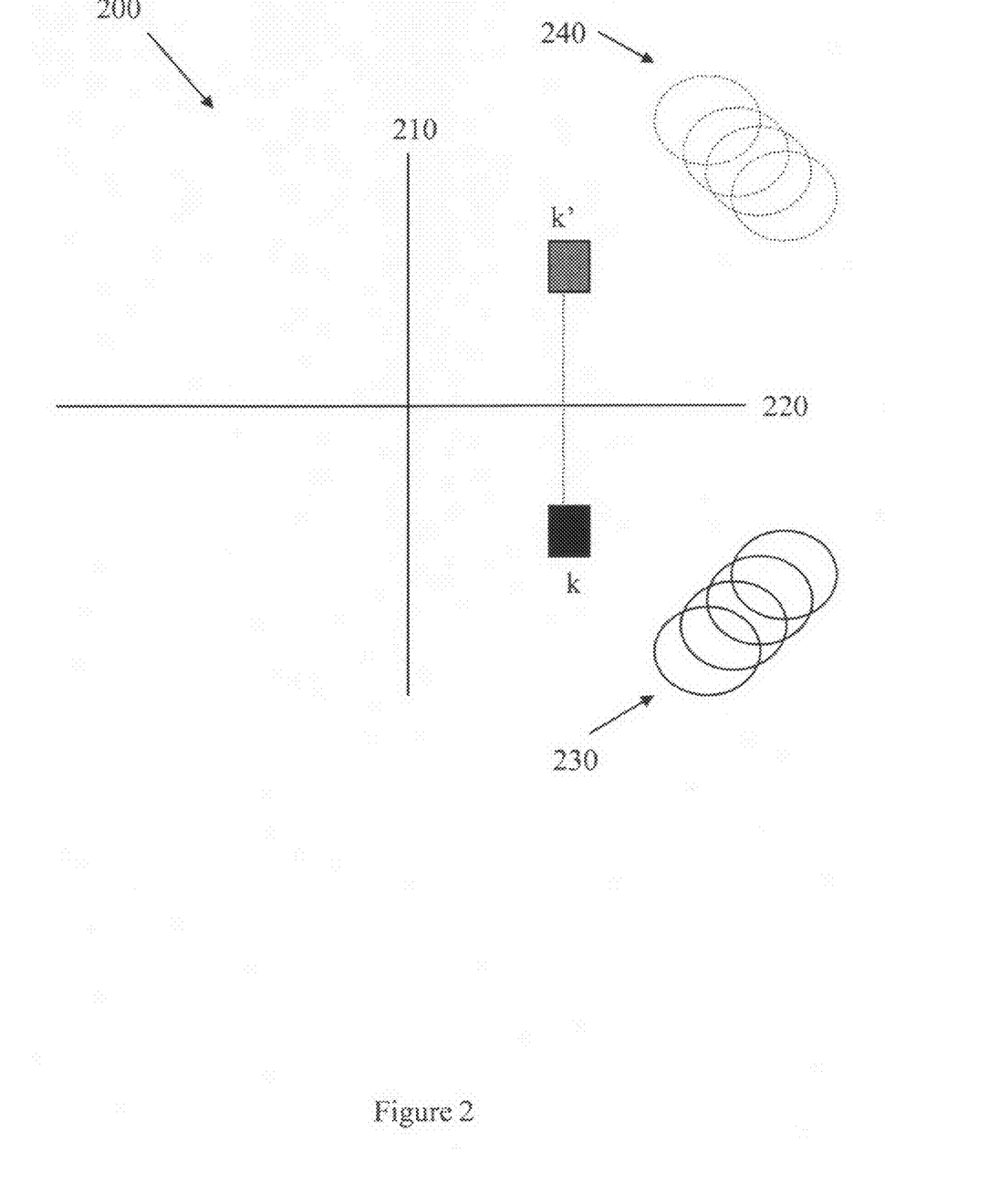
FIG. 2 illustrates a point in k-space, a real set of coils used in parallel acquisition, and a virtual set of coils.
Figure 3:
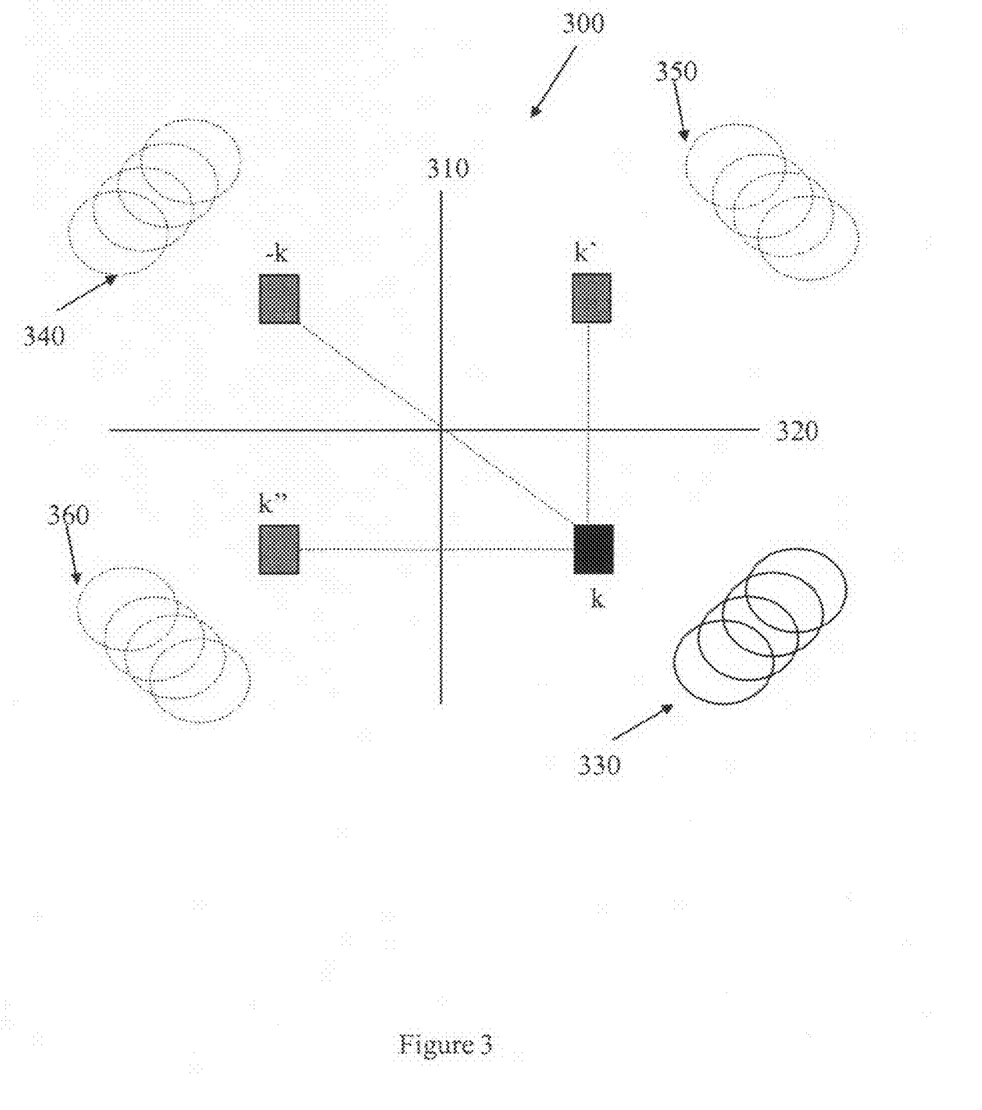
FIG. 3 illustrates a point in k-space, a real set of coils used in parallel acquisition, and three virtual sets of coils.

While FIG. 1 illustrates a point k, an actual set of coils 130, a point associated with a complex conjugate of point −k, and a virtual set of coils 140, example systems and methods may create other virtual coils using data acquired from other points. For example, FIG. 2 illustrates a point k and a point k'. Point k' is reflected across only the horizontal axis 220 in a k-space 200, and not across the vertical axis 210. Using data associated with coil 230 and points k and k', a virtual coil 240 can be constructed. Data associated with virtual coil 240 can then be employed in reconstruction. FIG. 3 illustrates points k, –k, k', and k". Real coils 330 can acquire data associated with point k. Conjugate symmetry can then be used to create virtual coils 340, 350, and 360 based on information associated with points k, –k, k', and k".

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
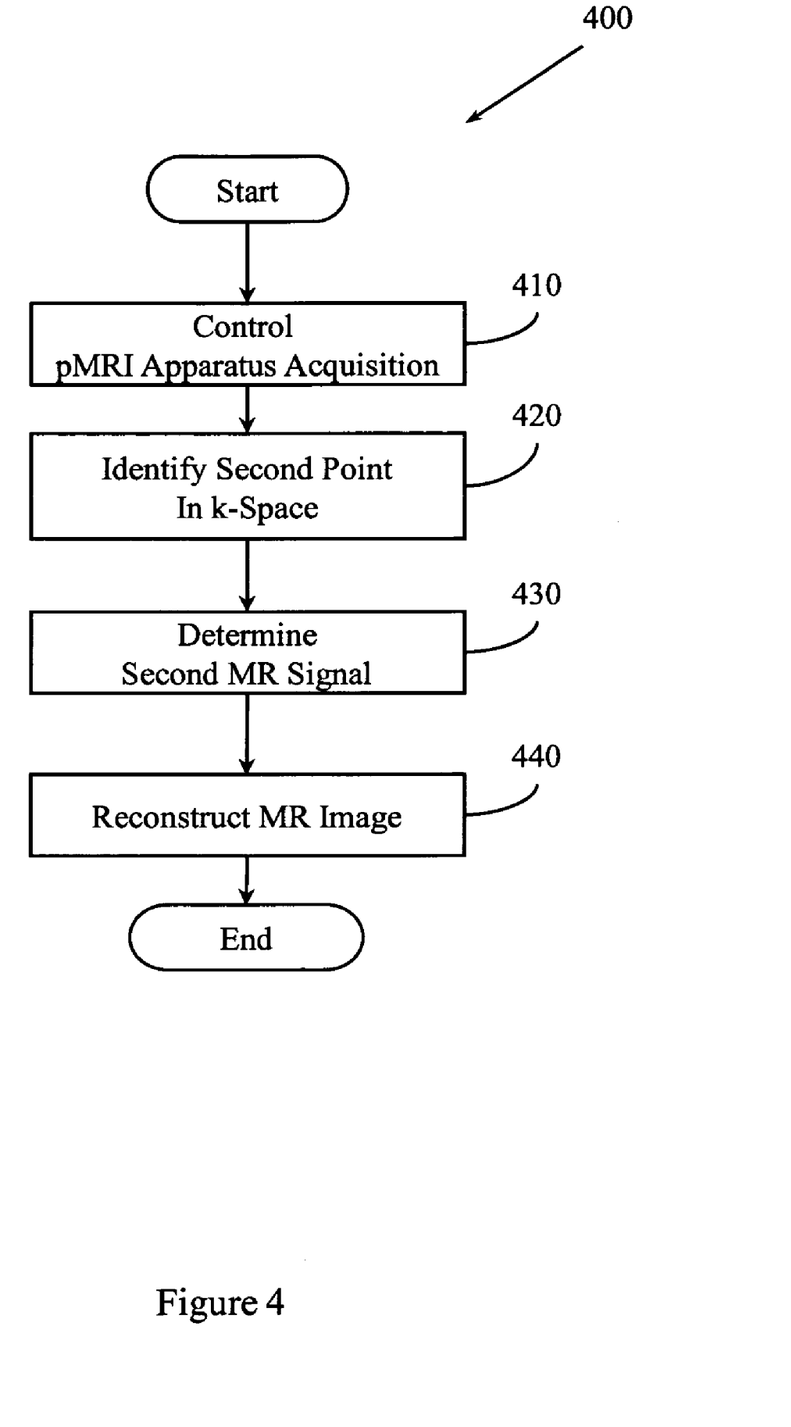
FIG. 4 illustrates a method that employs conjugate symmetry in parallel imaging.

FIG. 4 illustrates a method 400. Method 400 may include, at 410, controlling a pMRI apparatus to acquire a first MR signal from a first point in k-space using a phased array of receiving coils. The first signal may include data from a set of coils in a phased array of coils (e.g., 330 FIG. 3) and may be represented by:

$$S_j(k) \; j=1, \ldots N_c.$$

In one example, the first MR signal may be described by:

$$S_j(k) \triangleq FT(\delta(x) \cdot C_j(x))$$

where:

$S_j(k)$ represents a signal acquired from the first point (k) in k-space;

FT represents a Fourier Transform;

$\delta(x)$ represents a spin density; and $C_j(x)$ represents a coil sensitivity profile for a coil j in the phased array of receiving coils.

In one example, controlling the pMRI apparatus at 410 to acquire the first MR signal includes controlling the pMRI apparatus to perform a generalized auto-calibrating partially parallel acquisition (GRAPPA). Performing the GRAPPA may include, for example, acquiring a set of fully sampled auto-calibrating signal (ACS) line(s). In one example, the ACS lines are acquired using a variable density acquisition scheme while in another example the ACS lines are acquired using a time-interleaved acquisition scheme. In yet another example, a separate calibration acquisition could be performed. It should be appreciated that the reconstruction process used may not explicitly require estimates of the coil sensitivity ($C_j(x)$ above). These are used here for schematic purposes only.

Method 400 may also include, at 420, identifying a second point in k-space that is related to the first point by a conjugate symmetry relation. The second point may be related to the first point in different ways. For example, the second point may be related by a reflection in a horizontal axis in k-space, by a reflection in a vertical axis in k-space, by a 180 degree rotation in k-space, and so on. More generally the second point may be related by a reflection and/or rotation in k-space, where the reflection and/or rotation may be characterized using conjugate symmetry. In one example, the second point may be a complex conjugate and may correspond to a point like point −k (FIG. 1). Point −k is a reflection of point k about both axes 110 and 120 (FIG. 1). A signal "acquired" from a virtual coil associated with the second point may correspond to:

$$S_{j+Nc}(k)=S_j^*(-k).$$

While a complex conjugate and a reflection about both axes 110 and 120 (FIG. 1) is described, it is to be appreciated that other second signals may be "acquired" from other virtual coil element(s). For example, second points may include points like point k', and point k'' as illustrated in FIG. 3. Also, while a reflection about a vertical axis or horizontal axis is illustrated, the actual axes about which reflections may be performed may, in practice, be a mixture of spatial axes.

Method 400 may also include, at 430, determining a second MR signal associated with the second point based, at least in part, on the first MR signal and the conjugate symmetry relation. In one example, determining the second MR signal includes determining a result for:

$$S_j^*(-k) \triangleq FT(\delta^*(x) \cdot C_j^*(x))$$

where:

$S_j^*(-k)$ is associated with a signal from the second point in k-space, the second point being a complex conjugate associated with the first point in k-space;

FT represents a Fourier Transform;

$\delta^*(x)$ represents a spin density associated with the complex conjugate; and $C_j^*(x)$ represents a coil sensitivity profile for a virtual coil j in a virtual phased array of coils.

In another example, determining the second MR signal includes determining a result for:

$$S_j^*(k') \triangleq FT(\delta^*(x) \cdot C_j^*(x))$$

where:

$S_j^*(k')$ is associated with a signal from the second point in k-space, the second point being a symmetric point associated with the first point in k-space;

FT represents a Fourier Transform;

$\delta^*(x)$ represents a spin density associated with the symmetric point; and $C_j^*(x)$ represents a coil sensitivity profile for a virtual coil j in a virtual phased array of coils.

While examples for a rotation and a reflection have been provided, one skilled in the art will appreciate that the second MR signal may be determined according to other conjugate symmetry relationships. Method 400 may also include, at 440, reconstructing an MR image based, at least in part, on both the first MR signal and the second MR signal.

While FIG. 4 illustrates various actions occurring in serial, it is to be appreciated that various actions illustrated in FIG. 4 could occur substantially in parallel. By way of illustration, a first process could control pMRI acquisitions, a second process could identify second points and determine MR signals associated with those second points, and a third process could reconstruct an MR image. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, a computer-readable medium may store computer executable instructions that if executed by a machine (e.g., processor) cause the machine to perform method 400. While executable instructions associated with the method 400 are described as being stored on a computer-readable medium, it is to be appreciated that executable instructions associated with other example methods described herein may also be stored on a computer-readable medium.

While the above describes a method and an apparatus in terms of reflections and rotations in k-space and virtual coils, example systems and methods may be described more generally. Consider that in one example GRAPPA uses source points that are centered around a target point. In another example, GRAPPA uses source points that enclose and/or describe a region that includes a target point. Example systems and methods may use additional points that are neither centered around nor enclose a target point. These additional points may be arranged in virtual coils. The location of these virtual coil source points can be varied for different target locations. The location of the virtual coil source points can be varied because a conjugate position is determined for a target point. In one example, four different locations may be used in a reconstruction. While four different locations are described, it is to be appreciated that a greater and/or lesser number of locations may be used. With virtual coil source points determined, example systems and methods may then perform GRAPPA on original source coils and virtual coils. In one example, the conjugate for a virtual coil may be determined before performing GRAPPA.

Figure 5:
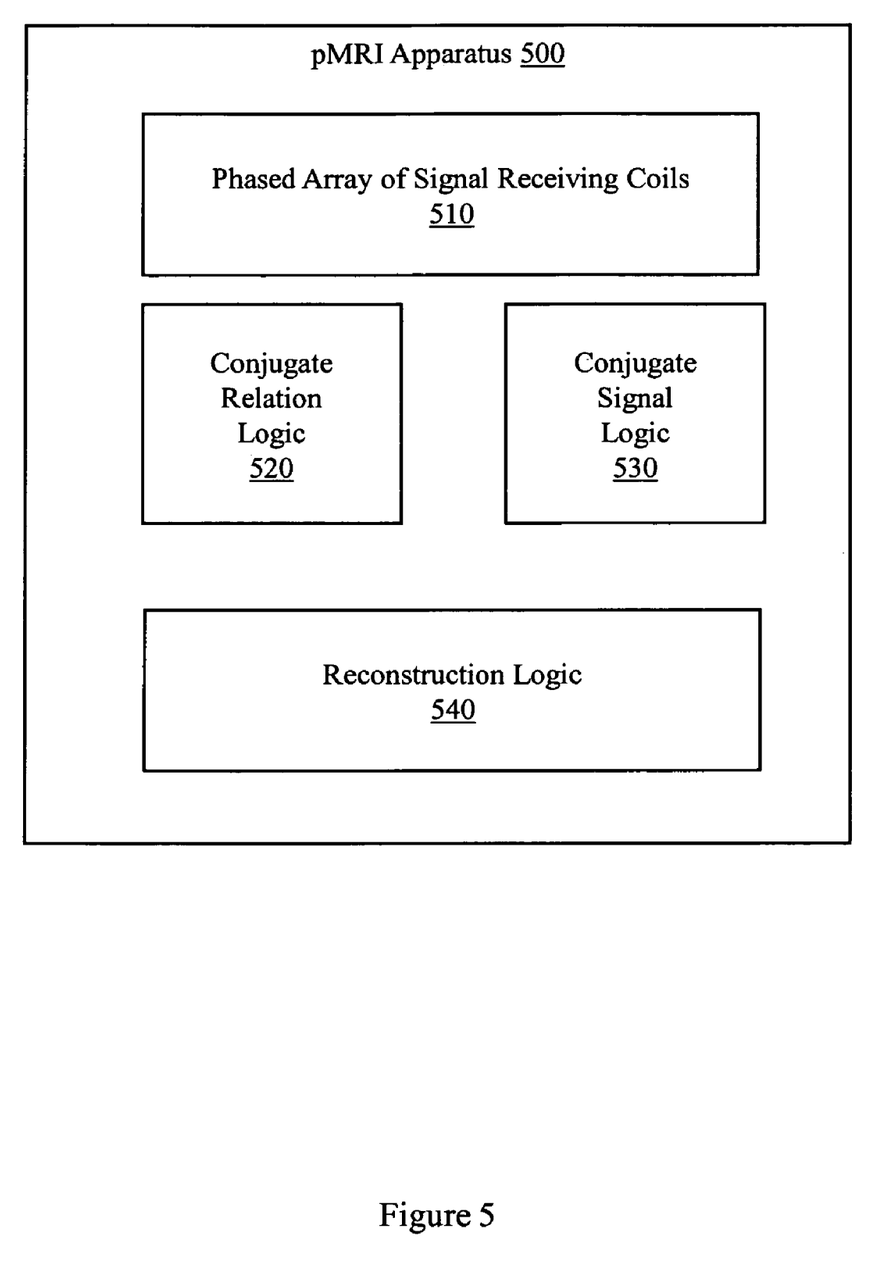
FIG. 5 illustrates a pMRI apparatus that employs conjugate symmetry.

FIG. 5 illustrates a pMRI apparatus 500. Apparatus 500 includes a phased array of signal receiving coils 510. The phased array 510 is to receive MR signals from an object to which the pMRI apparatus 500 applies RF energy. The imaging gradients may be applied in such a way to acquire projections along different directions or with different levels of encoding that will produce different results in the phased array 510. Phased array of receiving coils 510 may receive a first MR signal from a first point in k-space.

Apparatus 500 also includes a conjugate relation logic 520. Conjugate relation logic 520 is to identify a second point in k-space for which a second MR signal is to be computed from the first MR signal. The second point may be related to the first point by a conjugate symmetry relationship (e.g., reflection, rotation).

Apparatus 500 also includes a conjugate signal logic 530. Conjugate signal logic 530 is to compute the second MR signal from the first MR signal. The second signal may be computed based on the information available in the first MR signal and information available from the conjugate symmetry relationship.

Apparatus 500 also includes a reconstruction logic 540 to reconstruct an MR image based, at least in part, on the first MR signal and the second MR signal. The image may be displayed on a display that is operably connected to and/or incorporated into pMRI apparatus 500.

In one example, apparatus 500 may include a GRAPPA logic to control the pMRI apparatus 500 to perform a GRAPPA. While a GRAPPA logic is described, it is to be appreciated that more generally a parallel imaging logic could be employed. Thus, the GRAPPA logic is illustrative. The GRAPPA logic is to control the pMRI apparatus 500 to acquire a fully sampled ACS line(s) using acquisition techniques including, for example, a variable density acquisition scheme, a time-interleaved acquisition scheme, and so on.

While a single second point in k-space is described above, it is to be appreciated that pMRI apparatus 500 may process information associated with more than a single second point in k-space. For example, the conjugate relation logic 520 may identify multiple second points in k-space for which second MR signals are to be computed from the first MR signal. The second points may be related to the first point by different conjugate symmetry relationships (e.g., reflection, rotation). When multiple second points are involved, the conjugate signal logic 530 may compute multiple second MR signals from the first MR signal. In this example, multiple "virtual coils" may be constructed based on the relationships between the first point and the multiple second points. With multiple second points available, the reconstruction logic 540 may reconstruct the MR image based, at least in part, on the first MR signal and the second MR signals.

Figure 6:
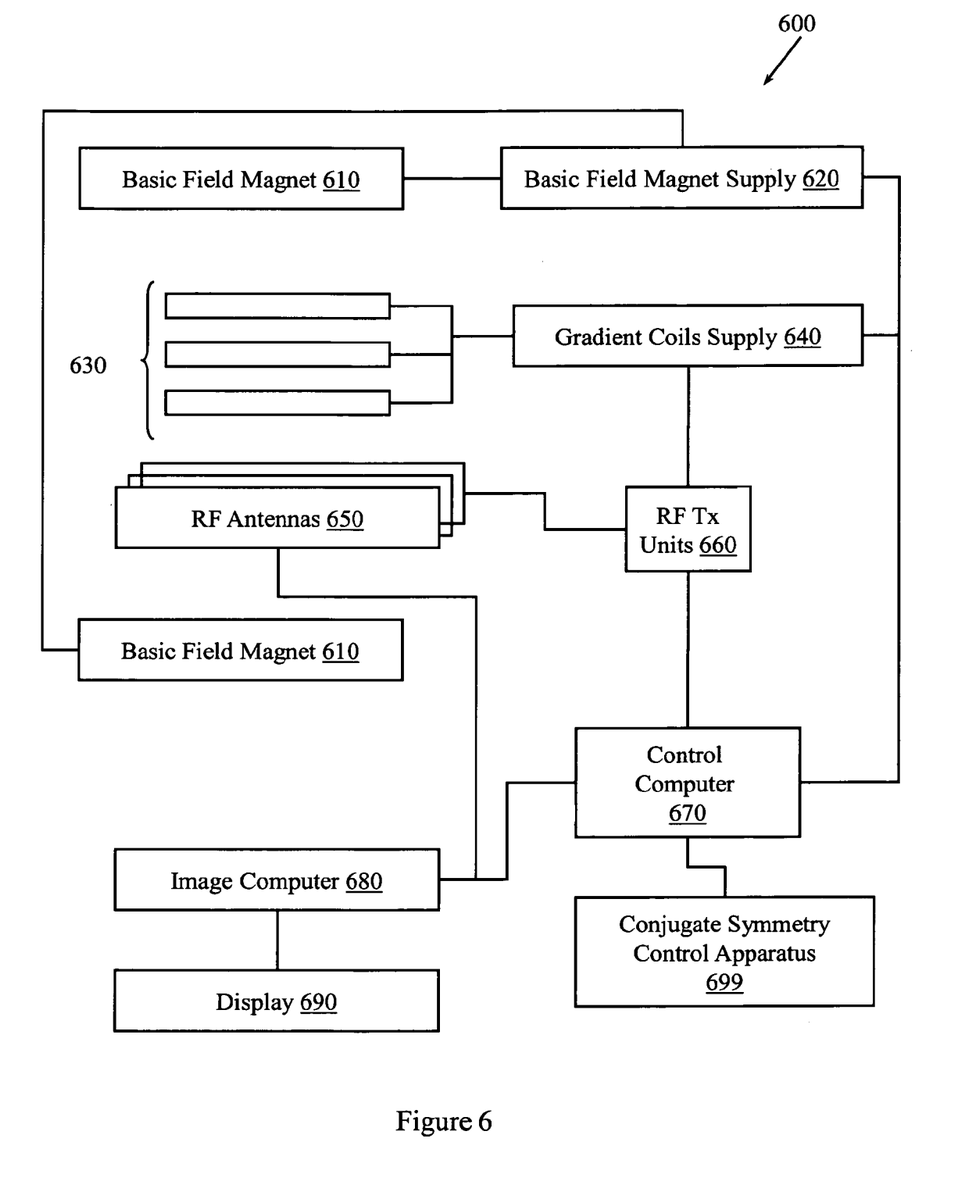
FIG. 6 illustrates a pMRI apparatus that employs conjugate symmetry.

FIG. 6 illustrates an example MRI apparatus 600 configured with a conjugate symmetry control apparatus 699 to facilitate using signal available in a "virtual coil" for a pMRI session. The information that is available is based on signal received from a first point in k-space with which a second point(s) are related by a conjugate symmetrical relationship. The conjugate symmetry control apparatus 699 may be configured with elements of example apparatus described herein and/or may perform example methods described herein.

The apparatus 600 includes a basic field magnet(s) 610 and a basic field magnet supply 620. Ideally, the basic field magnets 610 would produce a uniform Bo field. However, in practice, the $B_0$ field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 650 may be controlled, at least in part, by a set of RF transmission units 660. An RF transmission unit 660 may provide a signal to an RF antenna 650.

The gradient coils supply 640 and the RF transmission units 660 may be controlled, at least in part, by a control computer 670. In one example, the control computer 670 may be programmed to control a pMRI device as described herein. The magnetic resonance signals received from the RF antennas 650 can be employed to generate an image and thus may be subject to a transformation process like a two dimensional FFT that generates pixilated image data. The transformation can be performed by an image computer 680 or other similar processing device. The image data may then be shown on a display 690. While FIG. 6 illustrates an example MRI apparatus 600 that includes various components connected in various ways, it is to be appreciated that other MRI apparatus may include other components connected in other ways.

Figure 7:
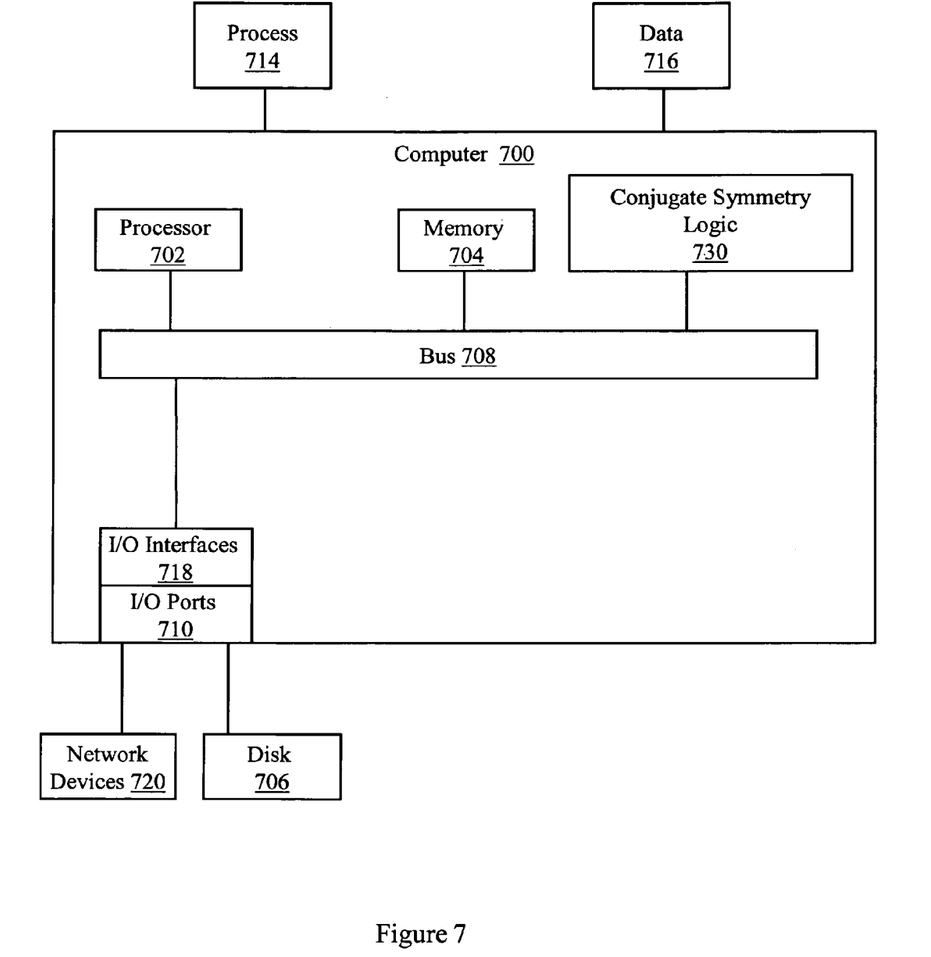
FIG. 7 illustrates an example computing environment in which example methods may be performed.

FIG. 7 illustrates an example computing device in which example methods described herein, and equivalents, may operate. The example computing device may be a computer 700 that includes a processor 702, a memory 704, and input/output ports 710 operably connected by a bus 708. In one example, the computer 700 may include a conjugate symmetry logic 730 to facilitate controlling a pMRI apparatus with respect to generating and using signal available for points related to other points in k-space through a conjugate symmetrical relationship. In different examples, the logic 730 may be implemented in hardware, software, firmware, and/or combinations thereof. While the logic 730 is illustrated as a hardware component attached to the bus 708, it is to be appreciated that in one example, the logic 730 could be implemented in the processor 702.

Thus, logic 730 may provide means (e.g., hardware, software, firmware) for determining first points having a conventional GRAPPA relationship to a target point. The first points may be associated with an original "actual" source coil. The means may be implemented, for example, as an ASIC programmed to process signal received from a phased array of receive antennas. The means may also be implemented as computer executable instructions that are presented to computer 700 as data 716 that are temporarily stored in memory 704 and then executed by processor 702. Logic 730 may also provide means (e.g., hardware, software, firmware) for determining a second point(s) not having a conventional GRAPPA relationship to the target point. Rather than being associated with an actual, physical coil, the second points may be associated with a virtual coil(s). With information available from both an actual coil and a virtual coil(s), logic 730 may also provide means (e.g., hardware, software, firmware) for performing GRAPPA based on signal associated with both the original source coil and the virtual coil(s). While GRAPPA is described, it is to be appreciated that other parallel acquisition schemes may be employed.

Generally describing an example configuration of the computer 700, the processor 702 may be a variety of various processors including dual microprocessor and other multiprocessor architectures. A memory 704 may include volatile memory and/or non-volatile memory. Non-volatile memory may include, for example, ROM, PROM, and so on. Volatile memory may include, for example, RAM, SRAM, DRAM, and so on.

A disk 706 may be operably connected to the computer 700 via, for example, an input/output interface (e.g., card, device) 718 and an input/output port 710. The disk 706 may be, for example, a magnetic disk drive, a solid state disk drive, a floppy disk drive, a tape drive, a Zip drive, a flash memory card, a memory stick, and so on. Furthermore, the disk 706 may be a CD-ROM drive, a CD-R drive, a CD-RW drive, a DVD ROM, and so on. The memory 704 can store a process 714 and/or a data 716, for example. The disk 706 and/or the memory 704 can store an operating system that controls and allocates resources of the computer 700.

The bus 708 may be a single internal bus interconnect architecture and/or other bus or mesh architectures. While a single bus is illustrated, it is to be appreciated that the computer 700 may communicate with various devices, logics, and peripherals using other busses (e.g., PCIE, 1374, USB, Ethernet). The bus 708 can be types including, for example, a memory bus, a memory controller, a peripheral bus, an external bus, a crossbar switch, and/or a local bus.

The computer 700 may interact with input/output devices via the i/o interfaces 718 and the input/output ports 710. Input/output devices may be, for example, a keyboard, a microphone, a pointing and selection device, cameras, video cards, displays, the disk 706, the network devices 720, and so on. The input/output ports 710 may include, for example, serial ports, parallel ports, and USB ports. The computer 700 can operate in a network environment and thus may be connected to the network devices 720 via the i/o interfaces 718, and/or the i/o ports 710. Through the network devices 720, the computer 700 may interact with a network. Through the network, the computer 700 may be logically connected to remote computers. Networks with which the computer 700 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

The invention claimed is:

1. A computer-readable medium storing computer executable instructions that when executed by a computer cause the computer to perform a method, the method comprising:

controlling a parallel magnetic resonance imaging (pMRI) apparatus to acquire a first magnetic resonance (MR) signal from a first point in k-space using a phased array of receiving coils;

identifying a second point in k-space that is related to the first point by a conjugate symmetry relation;

determining a second MR signal associated with the second point based, at least in part, on the first MR signal and the conjugate symmetry relation;

reconstructing an MR image based, at least in part, on both the first MR signal and the second MR signal;

where the second point is related to the first point by one or more of, a reflection across an axis in k-space and a 180 degree rotation in k-space; and where the first MR signal is described by:

$$S_j(k) \triangleq FT(\delta(x) \cdot C_j(x))$$

where:
Sj(k) represents a signal acquired from the first point (k) in k-space;
FT represents a Fourier Transform;
δ(x) represents a spin density; and
$C_j(x)$ represents a coil sensitivity profile for a coil j in the phased array of receiving coils.

2. The computer-readable medium of claim 1, where determining the second MR signal includes determining a result for:

$$S_j^*(-k) \triangleq FT(\delta^*(x) \cdot C_j^*(x))$$

where:
$Sj^*(-k)$ is associated with a signal from the second point in k-space, the second point being a complex conjugate associated with the first point in k-space;
FT represents a Fourier Transform;
δ*(x) represents a spin density associated with the complex conjugate; and
$C_j^*(x)$ represents a coil sensitivity profile for a virtual coil j in a virtual phased array of coils.

3. The computer-readable medium of claim 1, where determining the second MR signal includes determining a result for:

$$S_j^*(k') \triangleq FT(\delta^*(x) \cdot C_j^*(x))$$

where:
$Sj^*(k')$ is associated with a signal from the second point in k-space, the second point being a symmetric point associated with the first point in k-space;
FT represents a Fourier Transform;
δ*(x) represents a spin density associated with the symmetric point; and
$C_j^*(x)$ represents a coil sensitivity profile for a virtual coil j in a virtual phased array of coils.

4. The computer-readable medium of claim 1, where controlling the pMRI apparatus to acquire the first MR signal includes controlling the pMRI apparatus to perform a generalized auto-calibrating partially parallel acquisition (GRAPPA).

5. The computer-readable medium of claim 4, where performing the GRAPPA includes acquiring one or more fully sampled auto-calibrating signal (ACS) lines.

6. The computer-readable medium of claim 5, where the ACS lines are acquired using a variable density acquisition scheme.

7. The computer-readable medium of claim 5, where the ACS lines are acquired using a time-interleaved acquisition scheme.

8. A parallel MRI apparatus, comprising:
a phased array of receiving coils to receive a first MR signal from a first point in k-space;
a conjugate relation logic to identify a second point in k-space for which a second MR signal is to be computed from the first MR signal, the second point being related to the first point by a conjugate symmetry relationship;
a conjugate signal logic to compute the second MR signal from the first MR signal;
a reconstruction logic to reconstruct an MR image based, at least in part, on the first MR signal and the second MR signal;
where the first MR signal is described by:

$$S_j(k) \triangleq FT(\delta(x) \cdot C_j(x))$$

where:
Sj(k) represents a signal acquired from the first point (k) in k-space;
FT represents a Fourier Transform;
δ(x) represents a spin density; and
$C_j(x)$ represents a coil sensitivity profile for a coil j in the phased array of receiving coils.

9. The pMRI apparatus of claim 8, comprising:
a display to display the MR image.

10. The pMRI apparatus of claim 8, comprising:
a GRAPPA logic to control the pMRI apparatus to perform a GRAPPA.

11. The pMRI apparatus of claim 10, where the GRAPPA logic is to control the pMRI apparatus to acquire one or more fully sampled ACS lines using one or more of, a variable density acquisition scheme, and a time-interleaved acquisition scheme.

12. The pMRI apparatus of claim 8, where the second MR signal is related to the first MR signal by a complex conjugate relationship.

13. The pMRI apparatus of claim 12, where the second MR signal is described by:

$$S_j^*(-k) \triangleq FT(\delta^*(x) \cdot C_j^*(x))$$

where:
$Sj^*(-k)$ is associated with a signal from the second point in k-space, the second point being a complex conjugate associated with the first point in k-space;
FT represents a Fourier Transform;
δ*(x) represents a spin density associated with the complex conjugate; and
$C_j^*(x)$ represents a coil sensitivity profile for a virtual coil j in a virtual phased array of coils.

14. The pMRI apparatus of claim 8, where the second MR signal is related to the first MR signal by a conjugate symmetry relationship associated with a single reflection axis in k-space.

15. The pMRI apparatus of claim 14, where the second MR signal is described by:

$$S_j^*(k') \triangleq FT(\delta^*(x) \cdot C_j^*(x))$$

where:
$Sj^*(k')$ is associated with a signal from the second point in k-space, the second point being a symmetric point associated with the first point in k-space;

FT represents a Fourier Transform;
δ*(x) represents a spin density associated with the symmetric point; and
$C_j^*(x)$ represents a coil sensitivity profile for a virtual coil j in a virtual phased array of coils.

16. The pMRI apparatus of claim 8,
where the conjugate relation logic is to identify two or more second points in k-space for which second MR signals are to be computed from the first MR signal, the second points being related to the first point by conjugate symmetry relationships;
where the conjugate signal logic is to compute the second MR signals from the first MR signal; and
where the reconstruction logic is to reconstruct the MR image based, at least in part, on the first MR signal and the second MR signals.

17. A system, comprising:
means for determining one or more first points having a conventional GRAPPA relationship to a target point, the one or more first points being associated with an original source coil;
means for determining one or more second points not having a conventional GRAPPA relationship to the target point, the one or more second points being associated with a virtual coil; and
means for performing GRAPPA on both the original source coil and the virtual coil;

where determining the one or more first points is described by:

$$S_j(k) \triangleq FT(\delta(x) \cdot C_j(x))$$

where:
$S_j(k)$ represents a signal acquired from one or more first points (k) in k-space;
FT represents a Fourier Transform;
δ(x) represents a spin density; and
$C_j(x)$ represents a coil sensitivity profile for a coil j in a phased array of receiving coils; and
where determining the one or more second points comprise determining a result for:

$$S_j^*(-k) \triangleq FT(\delta^*(x) \cdot C_j^*(x))$$

where:
$S_j^*(-k)$ is associated with a signal from the one or more second points in k-space, the one or more second points being a complex conjugate associated with the one or more first points in k-space;
FT represents a Fourier Transform;
δ*(x) represents a spin density associated with the complex conjugate; and
$C_j^*(x)$ represents a coil sensitivity profile for a virtual coil j in a virtual phased array of coils.

* * * * *